United States Patent
Iizuka

(10) Patent No.: US 10,385,455 B2
(45) Date of Patent: Aug. 20, 2019

(54) FILM FORMING APPARATUS AND FILM FORMING METHOD

(71) Applicant: TOYOTA JIDOSHA KABUSHIKI KAISHA, Toyota-shi, Aichi-ken (JP)

(72) Inventor: Kazutaka Iizuka, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 115 days.

(21) Appl. No.: 15/491,231

(22) Filed: Apr. 19, 2017

(65) Prior Publication Data

US 2017/0306492 A1  Oct. 26, 2017

(30) Foreign Application Priority Data

Apr. 25, 2016  (JP) .................. 2016-086810

(51) Int. Cl.
 *C23C 16/44* (2006.01)
 *C23C 16/50* (2006.01)
 (Continued)

(52) U.S. Cl.
 CPC ............ *C23C 16/50* (2013.01); *C23C 16/042* (2013.01); *C23C 16/4409* (2013.01);
 (Continued)

(58) Field of Classification Search
 CPC ............. C23C 16/4585; C23C 16/458; C23C 16/4582; C23C 16/4583
 See application file for complete search history.

(56) References Cited

U.S. PATENT DOCUMENTS

2003/0196604 A1* 10/2003 Sidhwa ................ C23C 14/50
                                                         118/728
2006/0165994 A1*  7/2006 Dalakos .............. C04B 41/009
                                                         428/408

FOREIGN PATENT DOCUMENTS

JP        H02-00369 U     1/1990
JP        H02-102723 U    8/1990
(Continued)

*Primary Examiner* — Joseph A Miller, Jr.
(74) *Attorney, Agent, or Firm* — Finnegan, Henderson, Farabow, Garrett & Dunner, LLP

(57) ABSTRACT

A film forming apparatus configured to form a film on part of a work. The film forming apparatus comprises a film forming vessel comprising a first mold located above the work and a second mold located below the work to be opposed to the first mold. The first mold is configured to include a first recessed portion that is recessed upward viewed from a film formation target part of the work and a first planar portion arranged around the first recessed portion. The second mold is configured to include a second planar portion in a place opposed to the first planar portion. The film forming apparatus also comprises a first seal member located between the first planar portion and the work. The first seal member is configured to come into contact with the first planar portion and the work when the work is away from the first planar portion. The film forming apparatus further comprises a second seal member located between the second planar portion and the work. The second seal member is configured to come into contact with the second planar portion and the work when the work is away from the second planar portion. The second seal member is provided on a lower face of the work. This configuration suppresses poor film formation when the seal member is placed between the film forming vessel and the work.

4 Claims, 11 Drawing Sheets

(51) Int. Cl.
  *C23C 16/04* (2006.01)
  *C23C 16/458* (2006.01)
  *C23C 16/54* (2006.01)
  *H01J 37/00* (2006.01)

(52) U.S. Cl.
  CPC ...... *C23C 16/4412* (2013.01); *C23C 16/4585* (2013.01); *C23C 16/54* (2013.01); *H01J 37/00* (2013.01)

(56) References Cited

FOREIGN PATENT DOCUMENTS

| | | |
|---|---|---|
| JP | H07-180027 A | 7/1995 |
| JP | 7-199450 | 8/1995 |
| JP | 2002-141398 A | 5/2002 |
| JP | 2009-62579 | 3/2009 |
| JP | 2013-237883 | 11/2013 |
| JP | 2015-25173 | 2/2015 |

* cited by examiner

FILM FORMING APPARATUS AND FILM FORMING METHOD

CROSS-REFERENCE TO RELATED APPLICATIONS

The present application claims priority to Japanese patent application No. 2016-086810 filed on Apr. 25, 2016, the content of which is hereby incorporated by reference for all purpose.

BACKGROUND

Field

The present disclosure relates to a film forming apparatus and a film forming method.

Related Art

As an apparatus for film formation on a work, JP 2009-62579A describes an apparatus configured such that a work is placed between two halves of a vertically splittable film forming vessel and a film is formed on the work in the film forming vessel filled with a gas.

In the configuration that the work is placed between the halves of the film forming vessel, seal members may be provided between the film forming vessel and the work, in order to keep the inside of the film forming vessel airtight. For example, when seal members are provided in an upper mold and a lower mold of the film forming vessel, an undesired substance in the film forming vessel produced in the course of film formation may fall off by any of opening-closing operations of the film forming vessel, an operation of conveying the work into the film forming vessel and an operation of conveying the work out of the film forming vessel and may adhere to the seal member provided in the lower mold. This is likely to fail to keep the air tightness in the film forming vessel when the film forming vessel is closed and is likely to cause poor film formation. Accordingly there is a demand for a technique that suppresses poor film formation when film formation is performed with seal members provided between the film forming vessel and the work.

SUMMARY

According to one aspect of the disclosure, there is provided a film forming apparatus configured to form a film on part of a work. This film forming apparatus comprises a film forming vessel comprising a first mold located above the work and a second mold located below the work to be opposed to the first mold. The first mold is configured to include a first recessed portion that is recessed upward viewed from a film formation target part of the work and a first planar portion arranged around the first recessed portion. The second mold is configured to include a second planar portion in a place opposed to the first planar portion. The film forming apparatus also comprises a first seal member located between the first planar portion and the work. The first seal member is configured to come into contact with the first planar portion and the work when the work is away from the first planar portion. The film forming apparatus further comprises a second seal member located between the second planar portion and the work. The second seal member is configured to come into contact with the second planar portion and the work when the work is away from the second planar portion. The second seal member is provided on a lower face of the work. In the film forming apparatus of this aspect, the second seal member is provided on the lower face of the work. Even when an undesired substance falls off, this configuration suppresses the undesired substance from adhering to the second seal member. This configuration accordingly keeps the inside of the film forming vessel airtight when the film forming vessel is closed, and thereby suppresses poor film formation.

According to another aspect of the disclosure, there is provided a film forming method of forming a film on part of a work by a film forming apparatus. The film forming apparatus comprises a film forming vessel comprising a first mold located above the work and a second mold located below the work to be opposed to the first mold. The first mold is configured to include a first recessed portion that is recessed upward viewed from a film formation target part of the work and a first planar portion arranged around the first recessed portion. The second mold is configured to include a second planar portion in a place opposed to the first planar portion. The film forming apparatus also comprises a first seal member located between the first planar portion and the work. The first seal member is configured to come into contact with the work when the work is away from the first planar portion. The film forming apparatus further comprises a second seal member located between the second planar portion and the work. The second seal member is configured to come into contact with the work when the work is away from the second planar portion. The second seal member is provided on a lower face of the work. This film forming method comprises (a) moving the first mold upward relative to the work under condition that the first mold and the work are in contact with the first seal member and that the second mold and the work are in contact with the second seal member; and (b) moving the work upward relative to the second mold after starting the (a). The film forming method of this aspect moves the work upward relative to the second mold after moving the first mold upward relative to the work. This configuration suppresses an undesired substance out of a space formed by the second mold and the work from invading between the second mold and the work before the second seal member provided on the lower face of the work is separated from the second planar portion. This configuration accordingly keeps the inside of the film forming vessel airtight when the film forming vessel is closed, and thereby suppresses poor film formation. Additionally, the second seal member is provided on the lower face of the work. Even when an undesired substance falls off the configuration of rowing the work upward relative to the second mold suppresses the undesired substance from adhering to the second seal member and thereby suppresses poor film formation.

DETAILED DESCRIPTION

A. First Embodiment

A1. Configuration of Film Forming Apparatus

Figure 1:
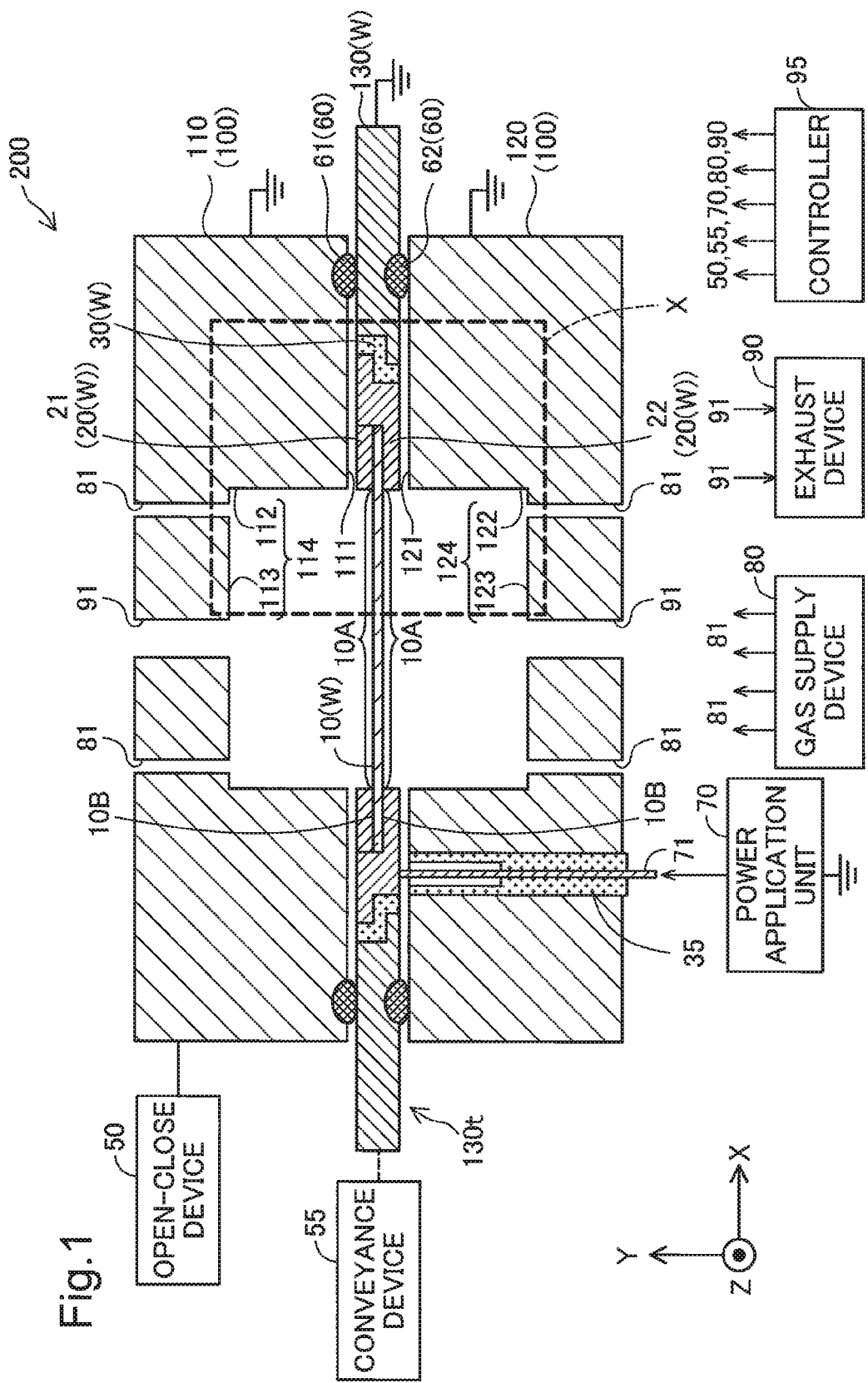
FIG. 1 is a schematic sectional view illustrating the configuration of a film forming apparatus according to a first embodiment of the disclosure.
Figure 2:
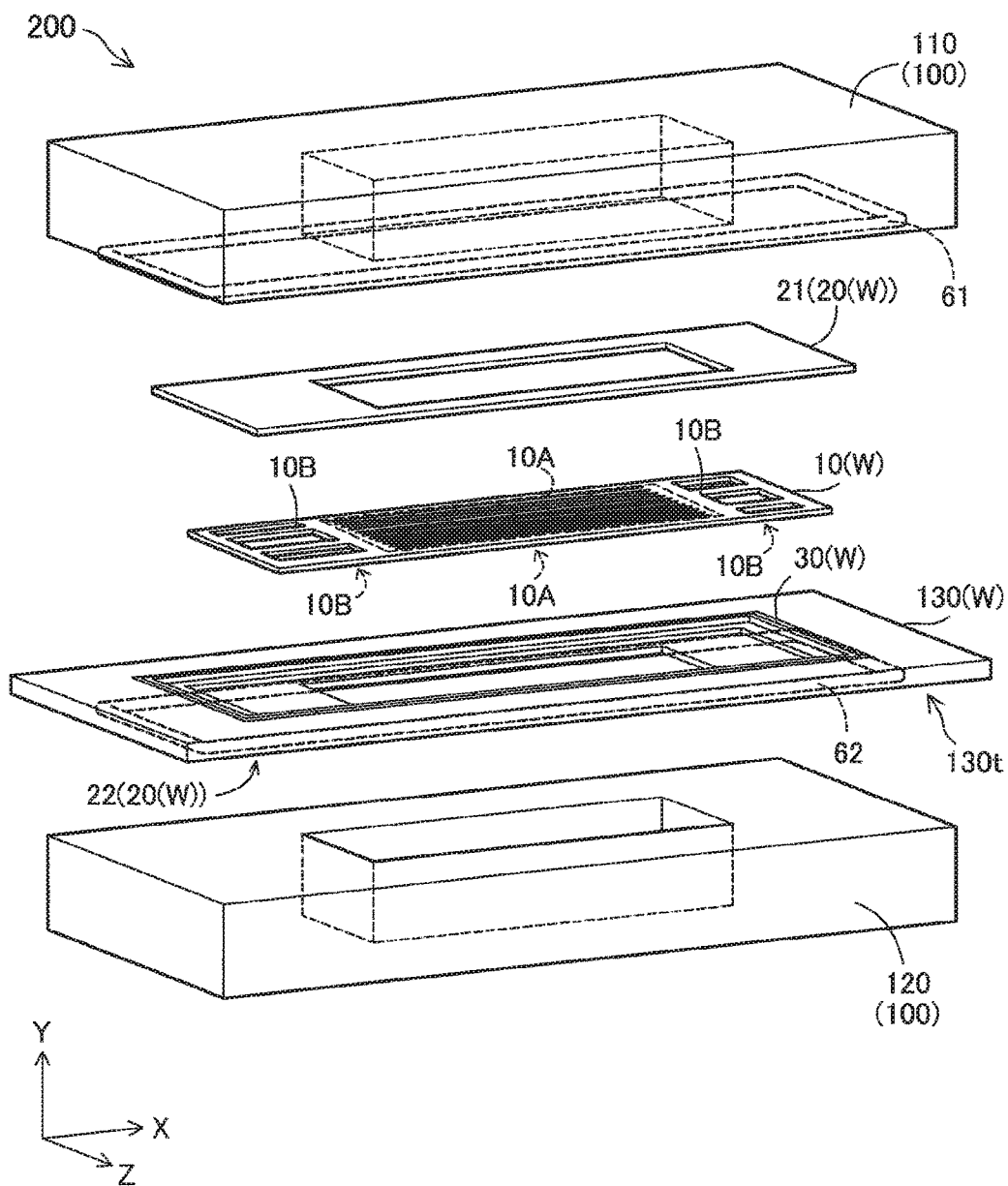
FIG. 2 is an exploded perspective view illustrating the film forming apparatus.

FIG. 1 is a schematic sectional view illustrating the configuration of a film forming apparatus 200 according to a first embodiment of the disclosure. FIG. 2 is an exploded perspective view illustrating the film forming apparatus 200. XYZ axes orthogonal to one another are illustrated in FIGS. 1 and 2. A Y-axis direction indicates a vertical direction, an X-axis direction indicates a horizontal direction, and a Z-axis direction indicates a direction perpendicular to both the Y axis and the X axis. +Y direction is upward direction, and −Y direction is downward direction. The same applies to subsequent drawings.

The film forming apparatus 200 is configured to form a film on a film formation target part 10A that is part of a work W. According to this embodiment, the film forming apparatus 200 may form a thin film on the film formation target part 100 by plasma CVD (chemical vapor deposition). According to this embodiment, the work W may include a film formation object 10, a masking member 20, an insulating member 30 and a pallet 130. According to this embodiment, the film formation object 10 is a tabular metal plate that is used as a base material for separators of a fuel cell. The film forming apparatus 200 may form, for example, a conductive carbon-based thin film on the film formation target part 10A of the film formation object 10.

The film forming apparatus 200 may include a film forming vessel 100 and seal members 60. The film forming apparatus 200 may further include an open-close device 50, a conveyance device 55, a power application unit 70, a gas supply device 80, an exhaust device 90 and a controller 95. The open-close device 50, the conveyance device 55, the power application unit 70 and its electric power introduction portion 71, the gas supply device 80 and its supply ports 81, the exhaust device 90 and its exhaust ports 91, and the controller 95 are omitted from the illustration of FIG. 2.

The film forming vessel 100 is a splittable metal container. The film forming vessel 100 may include a first mold 110 and a second mold 120. The first mold 110 includes a first recessed portion 114 that is recessed upward viewed from the film formation target part 10A of an upper face side of the work W and a first planar portion 111 arranged around the first recessed portion 114. According to this embodiment, the first recessed portion 114 includes a lateral portion 112 and a bottom portion 113. According to this embodiment, the connections between the first recessed portion 114 and the first planar portion 111 are located on a YZ plane to be flush with ends of the film formation target part 10A. The second mold 120 includes a second recessed portion 124 that is recessed downward viewed from the film formation target part 10A of a lower face side of the work W and a second planar portion 121 arranged around the second recessed portion 124. According to this embodiment, the second recessed portion 124 includes a lateral portion 122 and a bottom portion 123. The second planar portion 121 is provided at a location corresponding to the first planar portion 111 of the first mold 110. According to this embodiment, the connections between the second recessed portion 124 and the second planar portion 121 are located on the YZ plane to be flush with the ends of the film formation target part 10A. According to this embodiment, the first planar portion 111 and the second planar portion 121 are arranged parallel to an XZ plane. The first mold 110 and the second mold 120 respectively include supply ports 81 provided to introduce a gas from the gas supply device 80 into the film forming vessel 100, and exhaust ports 91 provided to discharge the gas from the film forming vessel 100 by the exhaust device 90. Openable and closable valves are provided at the supply ports 81 and the exhaust ports 91. The second mold 120 also includes an electric power introduction portion 71 configured to apply a voltage to the work W. The second mold 120 is electrically insulated from the electric power introduction portion 71 by an insulating member 35. According to this embodiment, the film forming vessel 100 has a ground potential. In the film forming vessel 100, the work W is placed away from the first planar portion 111. The film formation target part 10A of the work W is arranged to face the inner space of the first recessed portion 114 when the film forming vessel 100 is closed.

The masking member 20 is a member configured to cover film formation non-target parts 10B of the film formation object 10. In other words, the masking member 20 is a member that is open in the film formation target part 10A. According to this embodiment, the masking member 20 may include an upper masking member 21 and a lower masking member 22. The upper masking member 21 is placed on the upper face side of the film formation object 10. The lower masking member 22 is placed on the lower face side of the film formation object 10. According to this embodiment, the lower masking member 22 is configured to support the film formation object 10. The masking member 20 is made of a conductive material. The film formation object 10 and the masking member 20 are placed in contact with each other to be electrically connected with each other.

The insulating member 30 is placed between the first planar portion 111 and the second planar portion 121. According to this embodiment, the insulating member 30 is placed in contact with the masking member 20 when the film formation target part 10A of the upper face side of the work W is arranged to face the inner space of the first recessed portion 114 and the film formation object 10 and the masking member 20 are placed away from the first planar portion 111. According to this embodiment, the insulating member 30 is also placed in contact with the masking member 20 when the film formation target part 10A of the lower face side of the work W is arranged to face the inner space of the second recessed portion 124 and the film formation object 10 and the masking member 20 are placed away from the second planar portion 121. According to this embodiment, the insulating member 30 is placed in contact with the lower masking member 22 to support the lower masking member 22. The insulating member 30 may be made of a ceramic material, such as alumina ($Al_2O_3$) or silicon dioxide ($SiO_2$).

The pallet 130 is a metal plate-like member. According to this embodiment, the pallet 130 also serves as a member configured to convey the film formation object 10, the masking member 20 and the insulating member 30 into the film forming vessel 100. The insulating member 30, the lower masking member 22, the film formation object 10 and the upper masking member 21 are placed in this sequence on the pallet 130. According to this embodiment, the pallet 130 has the ground potential.

The seal members 60 (61, 62) are located between the work W and the film forming vessel 100. The seal members 60 are members configured to keep the inside of the film forming vessel 100 airtight. According to this embodiment, the seal members 60 are insulating members. According to this embodiment, the seal members 60 are rubber annular members. This embodiment employs O-rings for the seal members 60. A first seal member 61 is located between the first planar portion 111 and the work W and is placed in contact with the first planar portion 111 and the work W when the work W is placed away from the first planar portion 111. According to this embodiment, the first seal member 61 is fit in a groove provided in the first planar portion 111 of the first mold 110 and is in contact with an upper face of the pallet 130 when the film forming vessel 100 is closed. A second seal member 62 is located between the second planar portion 121 and the work W and is placed in contact with the second planar portion 121 and the work W when the work W is placed away from the second planar portion 121. The second seal member 62 is provided on the lower face of the work W. According to this embodiment, the second seal member 62 is fit in a groove provided in a lower face of the pallet 130 and is in contact with the second planar portion 121 when the film forming vessel 100 is closed. According to this embodiment, the first seal member 61 and the second seal member 62 have identical diameters.

The open-close device 50 is a device configured to open and close the film forming vessel 100. According to this embodiment, the open-close device 50 moves the first mold 110 upward relative to the work W to open the film forming vessel 100, while moving the first mold 110 downward relative to the work W to close the film forming vessel 100.

The conveyance device 55 is a device configured to convey the work W into the film forming vessel 100 and convey the work W out of the film forming vessel 100. According to this embodiment, when the conveyance device 55 is placed in contact with an end 130t of the pallet 130 and the film forming vessel 100 is opened, the conveyance device 55 conveys the pallet 130 and the insulating member 30, the masking member 20 and the film formation object 10 placed on the pallet 130 into the film forming vessel 100. The conveyance device 55 also moves the conveyed work W downward to place the work W on the second mold 120 via the second seal member 62. According to this embodiment, when the conveyance device 55 is placed in contact with the end 130t of the pallet 130 and the film forming vessel 100 is opened, the conveyance device 55 moves the pallet 130 upward relative to the second mold 120. The conveyance device 55 may also move the work W that is moved upward, along the XZ plane to convey the work W out of the film forming vessel 100. According to another embodiment, the open-close device 50 may be configured to be connectable with the pallet 130 and move the pallet 130 upward relative to the second mold 120.

The power application unit 70 is a device configured to produce a plasma. The power application unit 70 applies an electric power to the masking member 20 and the film formation object 10 of the work W. The power application unit 70 generates an electric field to produce a plasma from a raw material gas or an etching gas supplied into the film forming vessel 100. According to this embodiment, the electric power introduction portion 71, the film formation object 10 and the masking member 20 are negative poles, while the first mold 110, the second mold 120 and the pallet 130 are positive poles. According to this embodiment, the power application unit 70 applies a bias voltage to the film formation object 10 across the lower masking member 22. The power application unit 70 may apply, for example, a voltage of −3000 V to the electric power introduction portion 71. According to this embodiment, the film forming vessel 100 and the pallet 130 are connected to the ground (0 V).

The gas supply device 80 supplies a carrier gas and a raw material gas into the film forming vessel 100 via the supply ports 81. According to this embodiment, the gas supply device 80 may supply, for example, nitrogen (N) gas or argon (Ar) gas as the carrier gas and may supply, for example, pyridine ($C_5H_5N$) gas as the raw material gas. The gas supply device 80 is connected with tanks provided to store different types of gases. Changeover valves provided between the respective tanks and the supply ports 81 may be operated such that the gas supply device 80 changes over the type of the gas to be supplied to the supply ports 81. The gas supply device 80 may supply, for example, nitrogen gas into the film forming vessel 100 after film formation by the film forming apparatus 200, in order to return the internal pressure of the film forming vessel 100 to a pressure level that allows the film forming vessel 100 to be opened by the open-close device 50.

The exhaust device 90 discharges the gas from the film forming vessel 100 via the exhaust ports 91. The exhaust device 90 may be configured by, for example, a rotary pump, a diffusion pump or a turbo molecular pump.

The controller 95 controls the operations of the entire film forming apparatus 200. The controller 95 includes a CPU and a memory. The CPU executes programs stored in the memory to control the film forming apparatus 200. These programs may be recorded in various recording media. The controller 95 controls the open-close device 50 to move the first mold 110 upward relative to the work W under condition that the first mold 110 and the work W are in contact with the first seal member 61 and that the second mold 120 and the work W are in contact with the second seal member 62. The controller 95 subsequently controls the conveyance device 55 to move the work W upward relative to the second mold 120. The controller 95 also controls the conveyance device 55 to convey the work W. The controller 95 controls the exhaust device 90 to discharge the gas from the film forming vessel 100 and controls the gas supply device 80 to supply the gas into the film forming vessel 100. The controller 95 also controls the power application unit 70 to apply an electric power to the film formation object 10 across the lower masking member 22.

Figure 3:
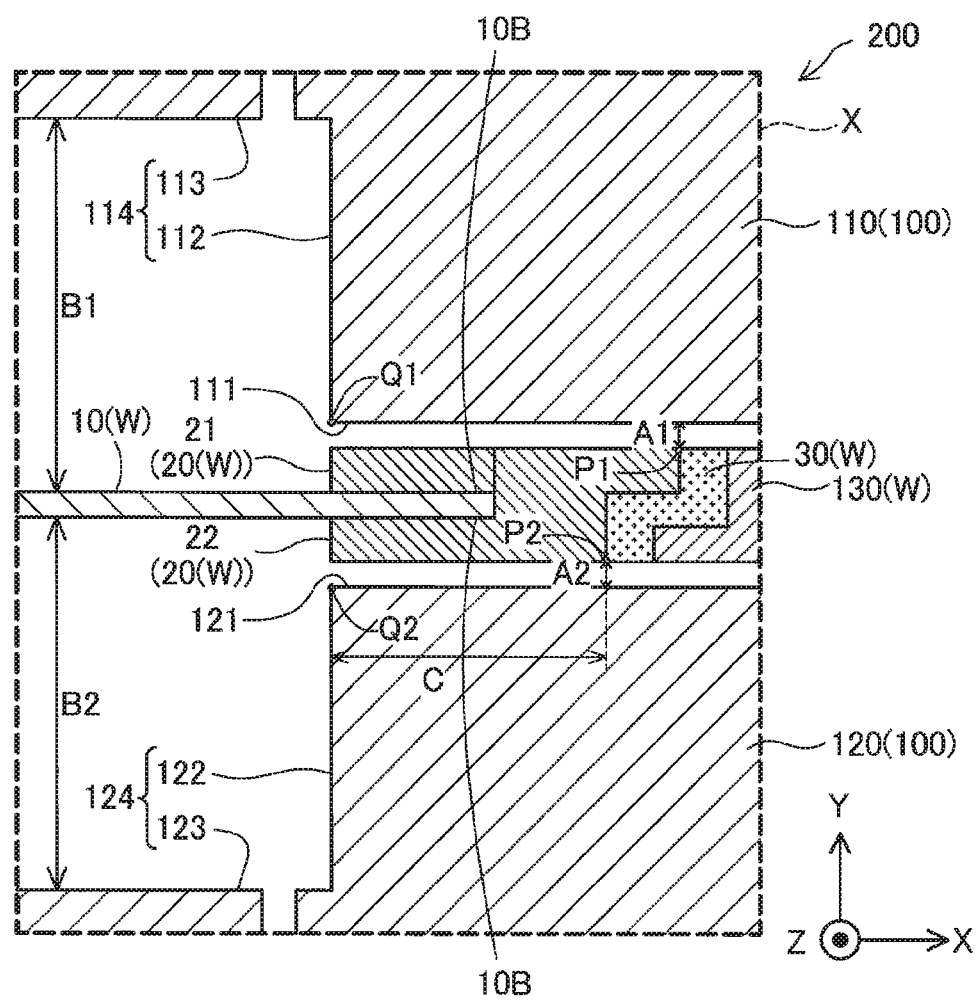
FIG. 3 is a partial enlarged view illustrating the film forming apparatus.

FIG. 3 is a partial enlarged view illustrating the film forming apparatus 200. FIG. 3 illustrates an area X shown by the broken line in FIG. 1. A contact position P1 and a contact position P2 between the masking member 20 and the insulating member 30 are shown in FIG. 3. The contact position P1 is a position opposed to the first planar portion 111 among positions where the negative pole of the work W is in contact with the insulating member 30. The contact position P2 is a position opposed to the second planar portion 121 among positions where the negative pole of the work W is in contact with the insulating member 30. FIG. 3 also shows a distance A1 between the contact position P1 and the first planar portion 111 and a distance B1 between the film formation object 10 and the bottom portion 113 of the first recessed portion 114. More specifically, the distance B1 denotes a distance between the negative pole of the work W opposed to the first recessed portion 114 and the bottom portion 113 of the first recessed portion 114. In the description below, the negative pole of the work W indicates the masking member 20 and the film formation object 10. FIG. 3 additionally shows a distance A2 between the contact position P2 and the second planar portion 121 and a distance B2 between the film formation object 10 and the bottom portion 123 of the second recessed portion 124. More specifically, the distance B2 denotes a distance between the negative pole of the work W opposed to the second recessed portion 124 and the bottom portion 123 of the second recessed portion 124. In the film forming apparatus 200, the distance A1 is smaller than the distance B1. In other words, a space formed by the negative pole of the work W and the first planar portion 111 is smaller than a space formed by the negative pole of the work W and the first recessed portion 114. According to this embodiment, the distance A2 is smaller than the distance B2. In other words, a space formed by the negative pole of the work W and the second planar portion 121 is smaller than a space formed by the negative pole of the work W and the second recessed portion 124.

According to this embodiment, the distance A1 and the distance A2 are shorter than the distances of sheaths formed between the negative pole (film formation object 10 and masking member 20) of the work W and the film forming vessel 100 (more specifically, the first planar portion 111 and the second planar portion 121) under application of an electric power between the negative pole of the work W and the film forming vessel 100 as the positive pole. According to this embodiment, the distance A1 and the distance A2 are equal to or less than 2.0 mm. The distance A1 and the distance A2 are preferably equal to or greater than 0.5 mm, in terms of ensuring sufficient insulation of the film forming vessel 100 from the film formation object 10 and the masking member 20.

FIG. 3 further shows a shortest distance C along the X axis from a connecting position Q1 of the first recessed portion 114 with the first planar portion 111 and a connecting position Q2 of the second recessed portion 124 with the second planar portion 121 to the contact positions P1 and P2. The distance C also denotes a shortest distance along the X axis from the lateral portion 112 of the first recessed portion 114 and the lateral portion 122 of the second recessed portion 124 to the contact positions P1 and P2. According to this embodiment, the distance C is larger than 0 (zero). According to this embodiment, the distance C is equal to or larger than 10 mm.

A2. Film Forming Method

Figure 4:
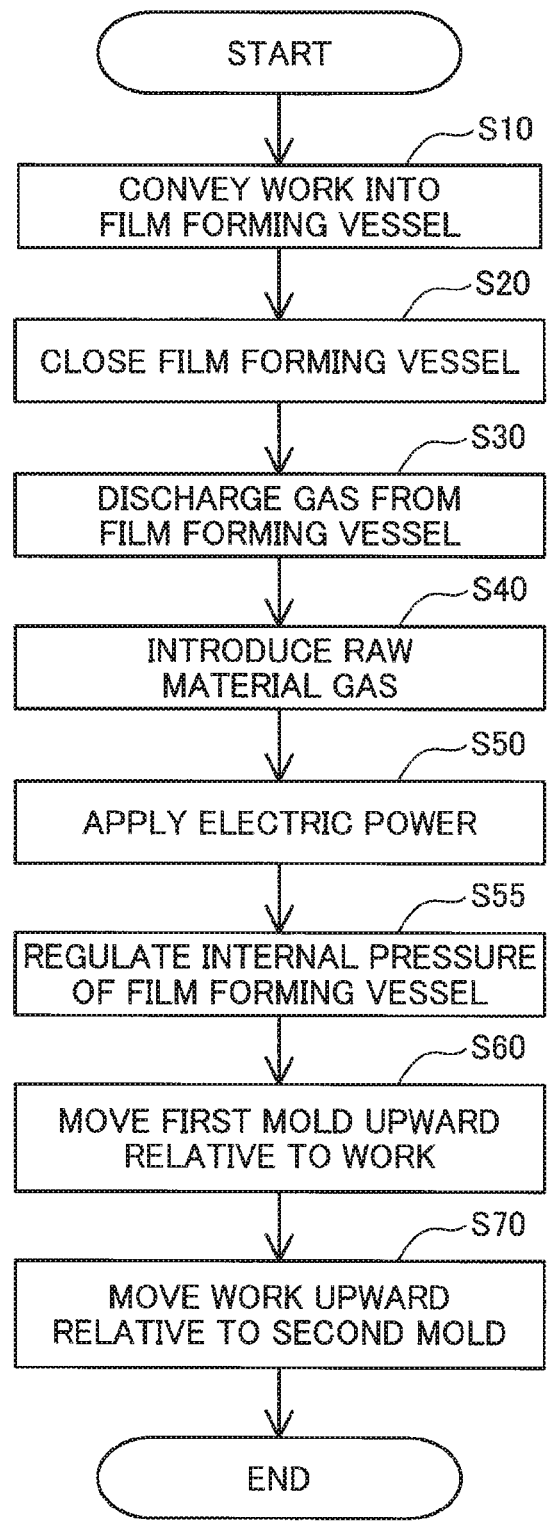
FIG. 4 is a process chart showing a film forming method by the film forming apparatus.

FIG. 4 is a process chart, showing a film forming method by the film, forming apparatus 200. In the process of film formation by the film forming apparatus 200, the work W is first conveyed into the film forming vessel 100 (step S10). According to this embodiment, the insulating member 30, the lower masking member 22 and the film formation object 10 are placed on the pallet 130, and the upper masking member 21 is further placed on the film formation object 10. This configuration causes the film formation non-target parts 10B of the film formation object 10 to be covered by the masking member 20. The first mold 110 of the film forming vessel 100 is subsequently moved upward by the open-close device 50, and the pallet 130 with the insulating member 30, the masking member 20 and the film formation objet 10 placed thereon is conveyed into the film forming vessel 100 by the conveyance device 55. The conveyed pallet 130 is moved downward and is placed on the second mold 120 via the second seal member 62.

The film forming vessel 100 is then closed (step S20). According to this embodiment, after the pallet 130 is conveyed into the film forming vessel 100, the first mold 110 is moved downward by the open-close device 50. When the film forming vessel 100 is closed, the film formation target part 10A is arranged to face the internal space of the first recessed portion 114 and the internal space of the second recessed portion 124 in the film forming vessel 100. The negative pole of the work W is placed away from the first planar portion 111 and the second planar portion 121. The distance A1 between the contact position P1 of the negative pole (masking member 20) of the work W with the insulating member 30 and the first planar portion 111 is smaller than the distance B1 between the negative pole (film formation object 10) of the work W and the first recessed portion 114. The distance A2 between the contact position P2 of the negative pole (masking member 20) of the work W with the insulating member 30 and the second planar portion 121 is smaller than the distance B2 between the negative pole (film formation object 10) of the work W and the second recessed portion 124.

Subsequently the gas is discharged from the film forming vessel 100 (step S30). According to this embodiment, the film forming apparatus 200 may be placed, for example, in a nitrogen atmosphere. At step S30, the exhaust device 90 is used to discharge the nitrogen gas from the film forming vessel 100 via the exhaust ports 91, so as to evacuate the film forming vessel 100.

After discharge of the gas from the film forming vessel 100, a raw material gas is introduced into the film forming vessel 100 (step S40). More specifically, at step S40, the gas supply device 80 introduces a carrier gas and a raw material gas via the supply ports 81. For example, hydrogen gas and argon gas may be introduced as the carrier gas into the film forming vessel 100. For example, nitrogen gas and pyridine gas may be introduced as the raw material gas into the film forming vessel 100. At step S40, the internal pressure of the film forming vessel 100 may be, for example, 11 Pa. For example, for the purpose of enhancing the film formation rate, prior to supply of the raw material gas, the power application unit 70 may apply an electric power between the negative pole (film formation object 10 and masking member 20) of the work W and the film forming vessel 100 to raise the temperature of the work W.

An electric power is then applied between the negative pole (film formation object 10 and masking member 20) of the work W and the film forming vessel 100 (step S50). When the electric power is applied between the negative pole of the work W and the film forming vessel 100 by the power application unit 70, a plasma is produced in the first recessed portion 114 and in the second recessed portion 124, so as to form a thin film on the film formation target part 10A of the film formation object 10. At step S50, an electric power of, for example, 3000V may be applied to the negative pole of the work W by the power application unit 70. Termination of step S50 stops the supply of the raw material gas and the application of an electric power and completes the film formation.

On completion of the film formation, the internal pressure of the file forming vessel 100 is regulated (step S55). According to this embodiment, nitrogen gas is supplied into the film forming vessel 100 by the gas supply device 80, in order to return the internal pressure of the film forming vessel 100 to a pressure level that allows the film forming vessel 100 to be opened by the open-close device 50.

Figure 5:
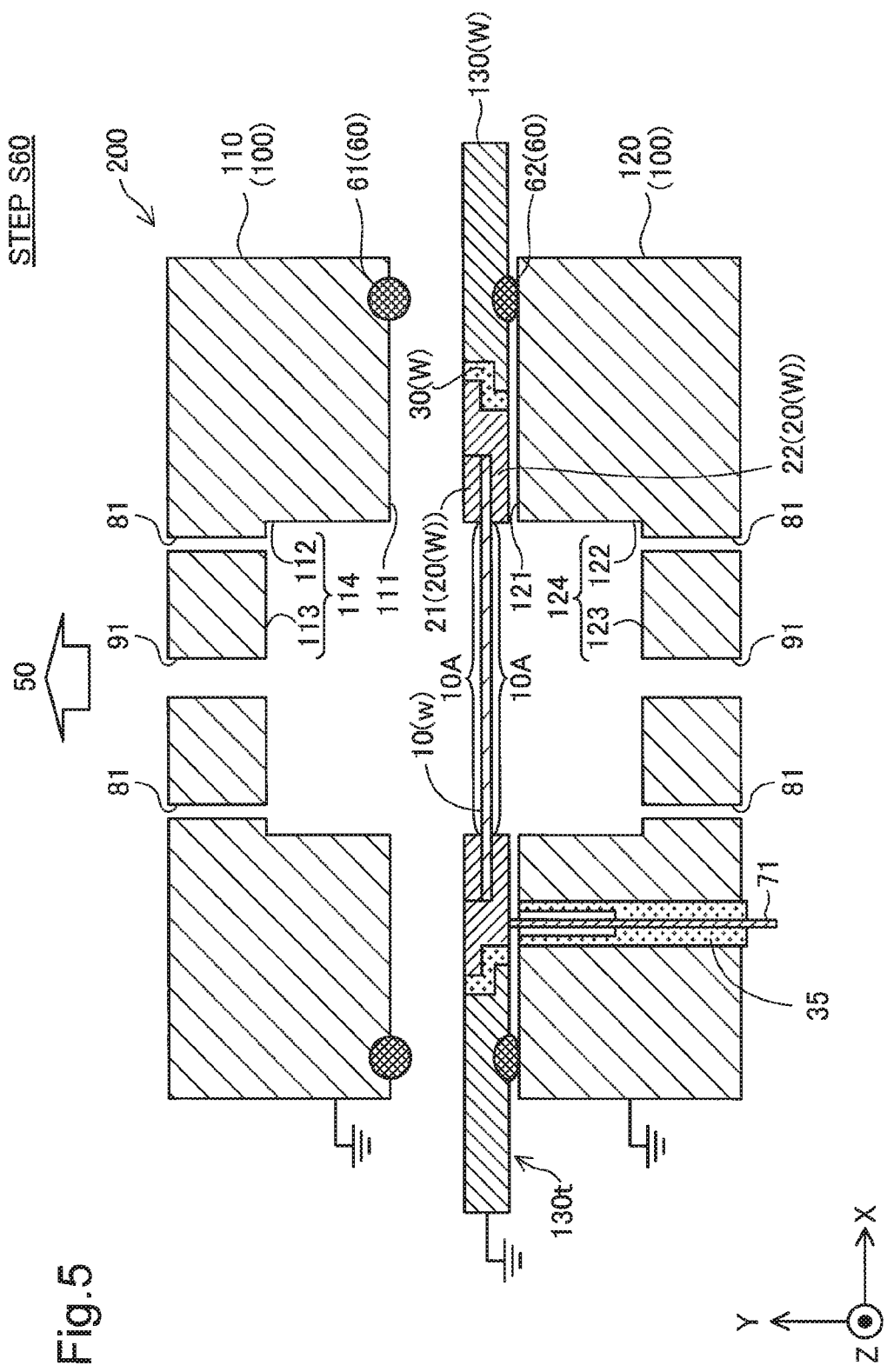
FIG. 5 is a diagram illustrating a process of moving a first mold upward relative to a work.

The first mold 110 is subsequently moved upward relative to the work W (step S60). FIG. 5 is a diagram illustrating a process of moving the first mold 110 upward relative to the work W. The open-close device 50, the conveyance device 55, the power application unit 70, the gas supply device 80, the exhaust device 90 and the controller 95 are omitted from the illustration of FIG. 5 and subsequent drawings. More specifically, at step S60, the controller 95 controls the open-close device 50 to move the first mold 110 upward relative to the work W. According to this embodiment, the first mold 110 is moved upward by the open-close device 50. This process is also called "process (a)".

Figure 6:
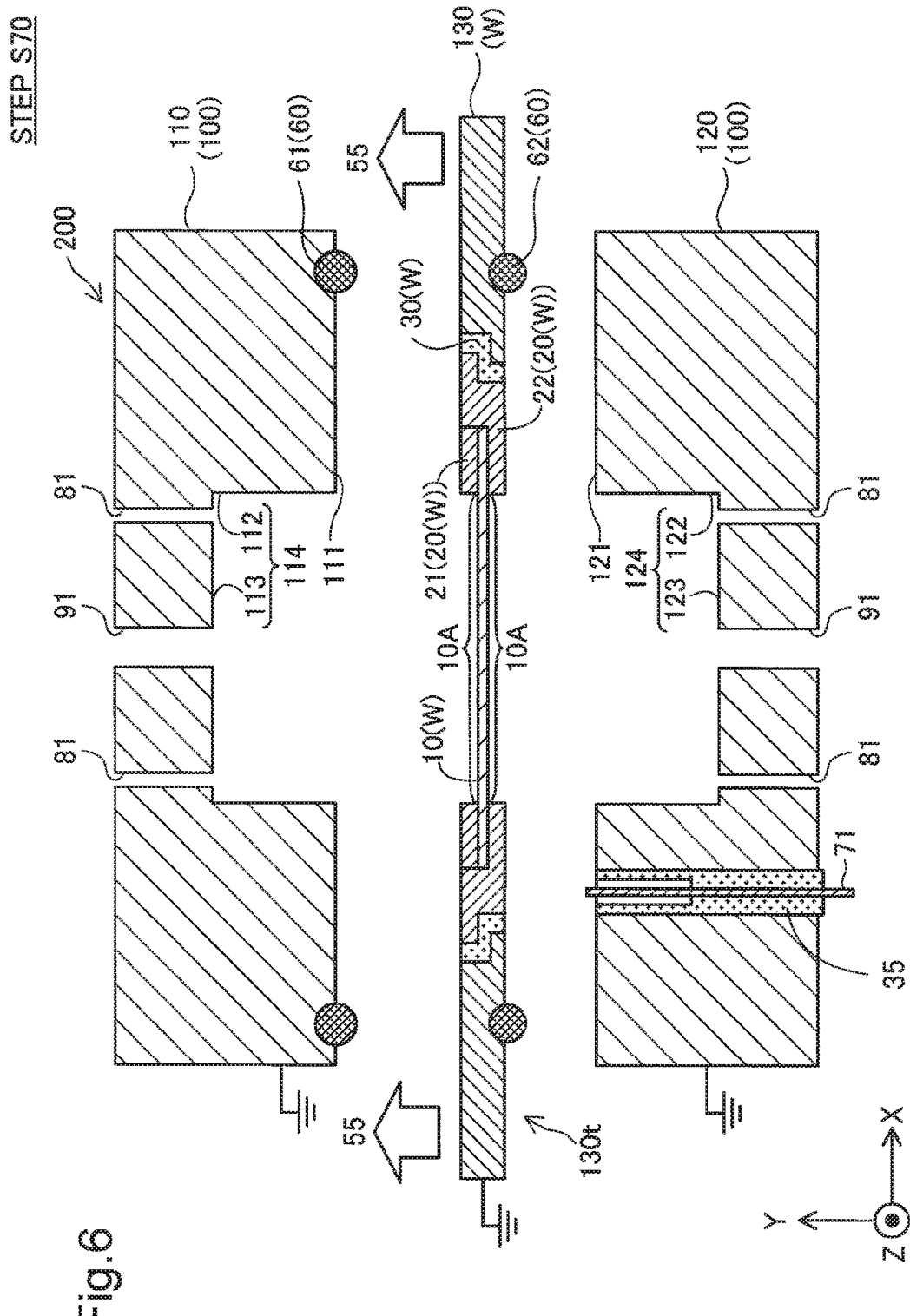
FIG. 6 is a diagram illustrating a process of moving the work upward relative to a second mold.

After the start of step S60, the work W is moved upward relative to the second mold 120 (step S70). FIG. 6 is a diagram illustrating a process of moving the work W upward relative to the second mold 120. According to this embodiment, the controller 95 controls the conveyance device 55 to come into contact with the end 130t of the pallet 130 and move the pallet 130 (i.e., the work W) upward relative to the second mold 120. This process is also called "process (b)". This process is preferably performed after step S60 is started to move the first mold 110 upward by the open-close, device 50 and the move of the first mold 110 is subsequently stopped. After this process, the work W is moved along the XZ plane and is conveyed out of the film forming vessel 100 by the conveyance device 55. This completes the film formation by the film forming apparatus 200.

A3. Advantageous Effects

A3-1. Advantageous Effect 1

An undesired substance is likely to adhere to the seal member in the process of film formation on the film formation object. The undesired substance may be, for example, a film depositing on the inner wall of the film forming vessel, in addition to on the film formation object, in the course of film formation. The undesired substance may also be flakes of the film depositing in the film forming vessel, which fall off by any of opening-closing operations of the film forming vessel during the film formation process, an operation of conveying the work into the film forming vessel and an operation of conveying the work out of the film forming vessel. The undesired substance may also be a foreign substance coming from outside of the film forming vessel to inside of the film forming vessel by any of these operations. The presence of such undesired substance adhering to the seal member may fail to keep the inside of the film forming vessel airtight when the film forming vessel is closed, and is likely to cause poor film formation. In the film forming apparatus 200 of the first embodiment, however, the second seal member 62 is provided on the lower face of the work W. Even when the undesired substance falls off, this configuration suppresses the undesired substance from adhering to the second seal member 62. This configuration accordingly keeps the inside of the film forming vessel 100 airtight when the film forming vessel 100 is closed, and thereby suppresses poor film formation.

In the film forming apparatus 200 of the first embodiment, the first seal member 61 is provided on the first planar portion 111. This configuration does not need to provide the first seal members 61 separately for a plurality of works W in the case where film formation is performed for the plurality of works W by the film forming apparatus 200. This configuration accordingly reduces the required number of first seal members 61.

The film forming method by the film forming apparatus 200 of the first embodiment moves the work W upward relative to the second mold 120 after moving the first mold 110 upward relative to the work W. This configuration suppresses the undesired substance out of the space formed by the second mold 120 and the work W from invading between the second mold 120 and the work W before the second seal member 62 provided on the lower face of the work W is separated from the second planar portion 121. This accordingly suppresses the undesired substance from adhering to the second seal member 62 and suppresses, poor film formation. This configuration accordingly keeps the inside of the film forming vessel 100 airtight when the film forming vessel 100 is closed, and thereby suppresses poor film formation.

Even when the undesired substance falls off by the vibration during the upward move of the first mold 110 relative to the work W, performing the process of moving the work W upward relative to the second mold 120 (step S70) after stopping the move of the first mold 110 suppresses the falling undesired substance from invading between the second mold 120 and the work W before the second seal member 62 provided on the lower face of the work W is separated from the second planar portion 121. This accordingly further suppresses the undesired substance from adhering to the second seal member 62. This configuration further keeps the inside of the film forming vessel 100 airtight when the film forming vessel 100 is closed, and thereby further suppresses poor film formation.

A3-2. Advantageous Effect 2

In the film forming apparatus 200 of the first embodiment, the insulating member 30 that comes into contact with the negative pole (masking member 20 and film formation object 10) of the work W is placed between the first planar portion 111 and the second planar portion 121 when the film forming vessel 100 is closed. The distance A1 between the contact position P1 of the negative pole of the work W with the insulating member 30 and the first planar portion 111 is smaller than the distance B1 between the negative pole of the work W and the bottom portion 113 of the first recessed portion 114. This configuration suppresses invasion of plasma from the first recessed portion 114 or the second recessed portion 124 into the space formed by the negative pole of the work W and the first planar portion 111 during film formation or etching using the plasma. This accordingly reduces the amount of plasma at the contact position P1 and thereby reduces the possibility of abnormal electrical discharge.

Similarly the distance A2 between the contact position P2 of the negative pole of the work W opposed to the second planar portion 121 with the insulating member 30 and the second planar portion 121 is smaller than the distance B2 between the negative pole of the work W and the bottom portion 123 of the second recessed portion 124. This configuration suppresses invasion of plasma from the second recessed portion 124 or the first recessed portion 114 into the space formed by the negative pole of the work W and the second planar portion 121. This accordingly reduces the amount of plasma at the contact position P2 and thereby reduces the possibility of abnormal electrical discharge.

The distance C along the X axis from the connecting position Q1 of the first recessed portion 114 with the first planar portion 111 and the connecting position Q2 of the second recessed portion 124 with the second planar portion 121 to the insulating member 30 is larger than 0 (zero). This causes the space for plasma production formed by the first recessed portion 114 and the second recessed portion 124 to be away from the contact positions P1 and P2 between the negative pole of the work W and the insulating member 30. This configuration further reduces the amount of plasma at the contact positions P1 and P2 and thereby further reduces the possibility of abnormal electrical discharge.

The distance A1 between the contact position P1 of the negative pole of the work W with the insulating member 30 and the first planar portion 111 is shorter than the distance of the sheath formed between the negative pole of the work W and the first planar portion 111. This configuration interferes with production of plasma between the negative pole of the work W and the first planar portion 111. The distance A2 between the contact position P2 of the negative pole of the work W with the insulating member 30 and the second planar portion 121 is shorter than the distance of the sheath formed between the negative pole of the work W and the second planar portion 121. This configuration interferes with production of plasma between the negative pole of the work W and the second planar portion 121. This effectively reduces the amount of plasma at the contact positions P1 and P2 and thereby effectively reduces the possibility of abnormal electrical discharge.

The distance A1 and the distance A2 are equal to or less than 2.0 mm. This configuration further suppresses invasion of plasma from the first recessed portion 114 and the second recessed portion 124 into the space formed by the negative pole of the work W and the first planar portion 111 and into the space formed by the negative pole of the work W and the second planar portion 121. This configuration interferes with production of plasma between the negative pole of the work W and the first planar portion 111. This also interferes with production of plasma between the negative pole of the work W and the second planar portion 121. This further reduces the amount of plasma at the contact positions P1 and P2 and thereby further reduces the possibility of abnormal electrical discharge.

In the film forming apparatus 200, the film formation target part 10A of the work W is arranged to face the internal space of the first recessed portion 114 and to face the internal space of the second recessed portion 124. The insulating member 30 and the end of the negative pole (masking member 20) of the work W are located between the first planar portion 111 and the second planar portion 121. This configuration allows for downsizing of the film forming apparatus 200, compared with a configuration that the entire work W is placed in the space for plasma production. Furthermore, the film forming apparatus 200 has a small space of evacuation for the purpose of film formation. This shortens the time period required for evacuation and thereby shortens the time period required for film formation on the film formation target part 161.

A4. Modifications of First Embodiment

A4-1. Modification 1 of First Embodiment

Figure 7:
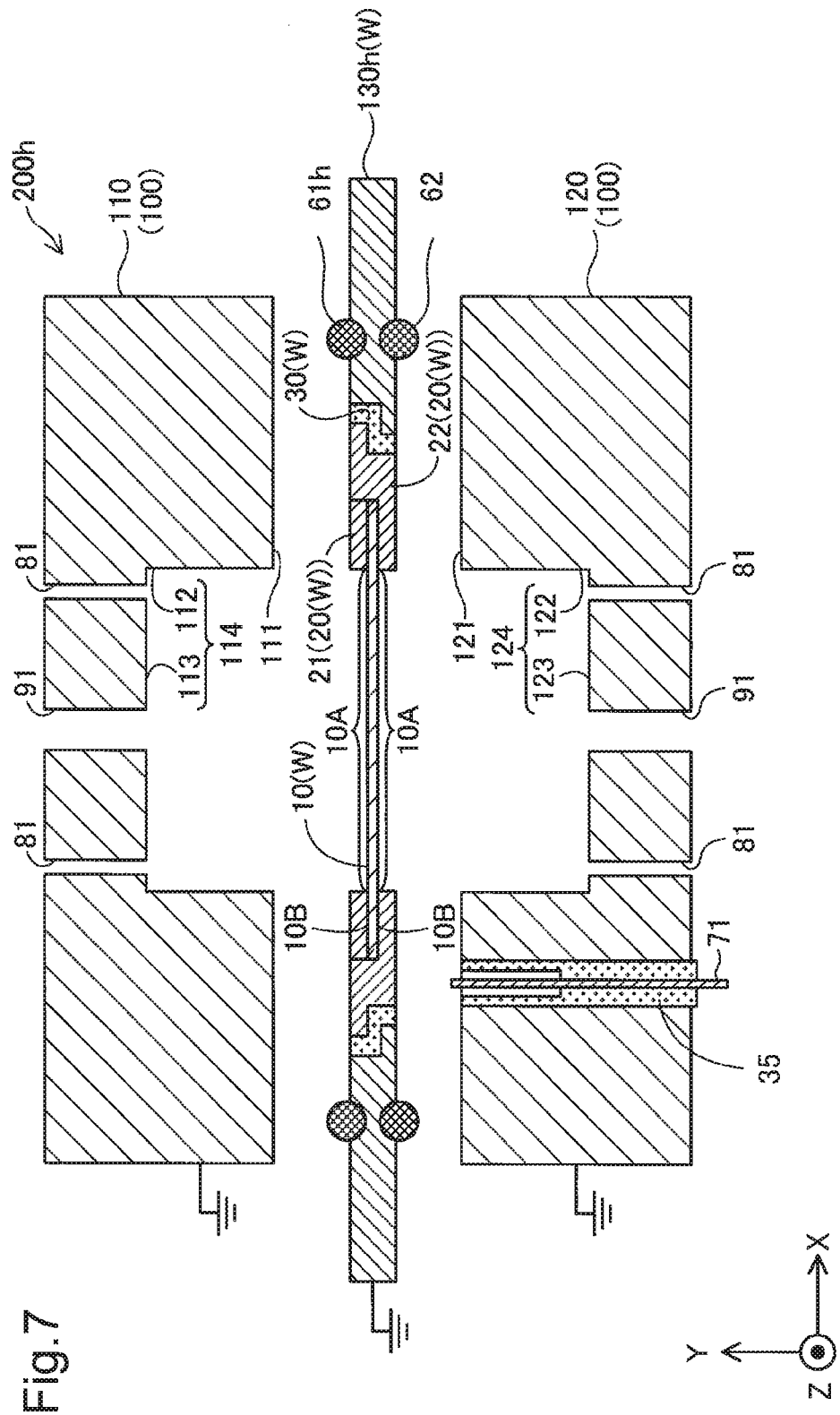
FIG. 7 is a diagram illustrating a film forming apparatus according to modification 1 of the first embodiment.

FIG. 7 is a diagram illustrating a film forming apparatus 200h according to modification 1 of the first embodiment. FIG. 7 illustrates the state that the first mold 110 is moved upward relative to the work W and the work W is subsequently moved upward relative to the second mold 120. The film forming apparatus 200h of this modification differs from the film forming apparatus 200 of the first embodiment described above by mainly a configuration that a first seal member 61h is provided not on the first planar portion 111 but on the upper face of the work W. According to this modification, the first seal member 61h is fit in a groove provided in an upper face of a pallet 130h and is in contact with the first planar portion 111 when the film forming vessel 100 is closed. As in the first embodiment described above, the second seal member 62 is provided on the lower face of the work W in this modification. The other configuration of this modification is similar to that of the first embodiment described above.

In this film forming apparatus 200h, the second seal member 62 is provided on the lower face of the work W. Like the first embodiment described above, even when an undesired substance falls off, this configuration suppresses the undesired substance from adhering to the second seal member 62. This configuration accordingly keeps the inside of the film forming vessel 100 airtight when the film forming vessel 100 is closed, and thereby suppresses poor film formation.

A4-2. Modification 2 of First Embodiment

Figure 8:
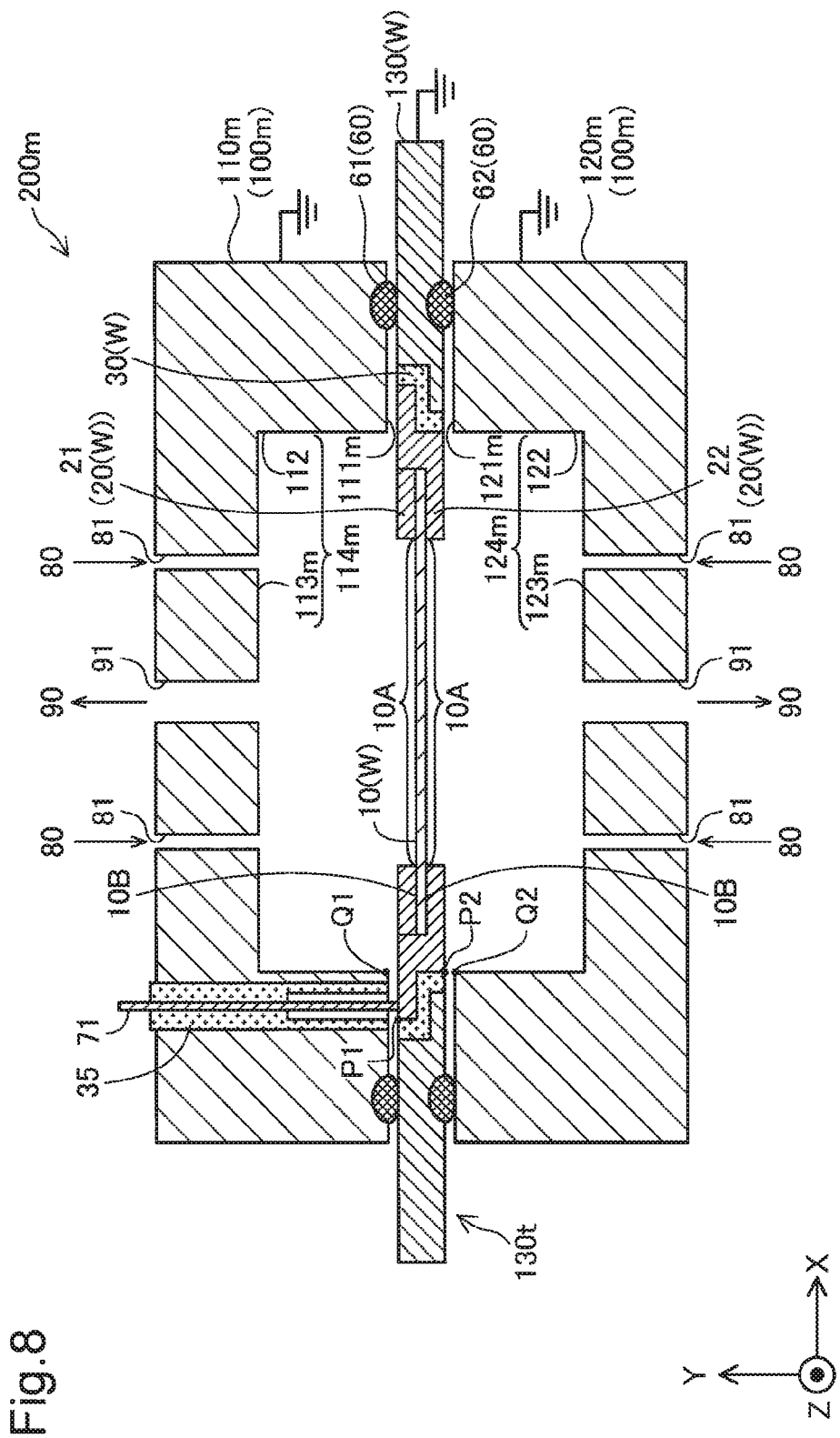
FIG. 8 is a diagram illustrating a film forming apparatus according to modification 2 of the first embodiment.

FIG. 8 is a diagram illustrating a film forming apparatus 200m according to modification 2 of the first embodiment. In the film forming apparatus 200m of this modification, a shortest distance along a first planar portion 111m from a connecting position Q1 of a first recessed portion 114m with the first planar portion 111m and a connecting position Q2 of a second recessed portion 124m with a second planar portion 121m to the contact positions P1 and P2 of the negative pole of the work W with the insulating member 30 is 0 (zero). According to this modification, the connecting position Q2 and the contact position P2 are located on an identical YZ plane. Accordingly, as shown in FIG. 8, in a film forming vessel 100m, the upper masking member 21 is exposed inside of the first recessed portion 114m of a first mold 110m, and part of the lower masking member 22 is exposed inside of the second recessed portion 124m of a second mold 120m. As in the first embodiment described above, in this modification, the distance between the contact position P1 and the first planar portion 111m is smaller than the distance between the negative pole of the work W and a bottom portion 113m of the first recessed portion 114m. Similarly the distance between the contact position P2 and the second planar portion 121m is smaller than the distance between the negative pole of the work W and a bottom portion 123m of the second recessed portion 124m. This film forming apparatus 200m also reduces the possibility of abnormal electrical discharge, like the first embodiment described above. As in the first embodiment described above, the second seal member 62 is provided on the lower face of the work W in this modification. Like the first embodiment described above, this configuration keeps the inside of the film forming vessel 100m airtight when the film forming vessel 100m is closed, and thereby suppresses poor film formation.

A4-3. Modification 3 of First Embodiment

According to the first embodiment described above, the work W is configured to include the film formation object 10, the masking member 20, the insulating member 30 and the pallet 130. According to a modification, however, the work W may be configured to include only the film formation object 10. In other words, the work W may be configured to exclude the masking member 20, the insulating member 30 and the pallet 130. In this modification, the second seal member 62 may be provided on a lower face of the film formation object 10. The film formation object 10 may be conveyed by the conveyance device 55. In this modification, the above contact position P1 may be a position where the film formation object 10 is in contact with the first seal member 61, and the above contact position P2 may be a position where the film formation object 10 is in contact with the second seal member 62. The above distance C may be a shortest distance along the X axis from the connecting position of the first recessed portion 114 with the first planar portion 111 and the connecting position of the second recessed portion 124 with the second planar portion 121 to the position where the film formation object 10 is in contact with the first seal member 61 or the second seal member 62.

According to another modification, the work W may be configured to include the film formation object 10 and the masking member 20. In other words, the work W may be configured to exclude the insulating member 30 and the pallet 130. In this modification, the second seal member 62 may be provided on a lower face of the film formation object 10 or the lower masking member 22. The film formation object 10 and the masking member 20 may be conveyed by the conveyance device 55. In this modification, the above contact position P1 may be a position where the film formation object 10 or the masking member 20 is in contact with the first seal member 61, and the above contact position P2 may be a position where the film formation object 10 or the masking member 20 is in contact with the second seal member 62. The above distance C may be a shortest distance along the X axis from the connecting position of the first recessed portion 114 with the first planar portion 111 and the connecting position of the second recessed portion 124 with the second planar portion 121 to the position where the film formation object 10 or the masking member 20 is in contact with the first seal member 61 or the second seal member 62.

A4-4. Modification 4 of First Embodiment

According to the first embodiment described above, the film forming apparatus 200 employs plasma CVD for film formation. The film forming apparatus 200 may, however, employ another technique such as physical vapor deposition (PVD) for film formation on the film formation target part 10A. For example, the film forming apparatus 200 may be equipped with a mechanism of vaporizing (or sublimating) a film formation material in the film forming vessel 100 and may form a film on the film formation target part 10A by the vapor deposition technique. In another example, the film forming apparatus 200 may be equipped with a mechanism of causing particles obtained by vaporization of the film formation material to pass through plasma and may form a film on the filth formation target part 10A by the ion plating technique. In another example, the film forming apparatus 200 may be equipped with a mechanism of causing high-energy particles to collide against the film formation material (target) and may form a film on the film formation target part 10A by the sputtering technique.

A4-5. Other Modifications of First Embodiment

According to the first embodiment described above, the distance A1 between the contact position P1 and the first planar portion 111 is shorter than the distance of the sheath formed between the negative pole of the work W and the first planar portion 111. Similarly the distance A2 between the contact position P2 and the second planar portion 121 is shorter than the distance of the sheath formed between the negative pole of the work W and the second planar portion 121. According to a modification, either one of the distance A1 and the distance A2 may be larger than the distance of the sheath, or both the distance A1 and the distance A2 may be larger than the distances of the sheaths. According to the first embodiment described above, the distance A1 and the distance A2 are equal to or less than 2.0 mm. According to a modification, either one of the distance A1 and the distance A2 may be greater than 2.0 mm, or both the distance A1 and the distance A2 may be greater than 2.0 mm.

According to the first embodiment described above, the first recessed portion 114 includes the lateral portion 112 and the bottom portion 113. According to a modification, the first recessed portion 114 may have any configuration to be recessed from the first planar portion 111 in a direction away from the film formation object 10 and may be, for example, in a semispherical shape. In this modification, the distance B1 between the negative pole of the work W and the bottom portion 113 of the first recessed portion 114 may be a distance between the negative pole of the work W opposed to the first recessed portion 114 and a position of the first recessed portion 114 farthest from the negative pole of the work W.

According to the above embodiment, the film forming vessel 100 and the pallet 130 have the ground potential. According to a modification, in the process of film formation by plasma CVD, the film forming vessel 100 and the pallet 130 may not have the ground potential. The power application unit 70 may have any configuration to apply an electric power between the film forming vessel 100 and the film formation object 10 for film formation on the film formation object 10.

B. Second Embodiment

B1. Configuration of Film Forming Apparatus

Figure 9:
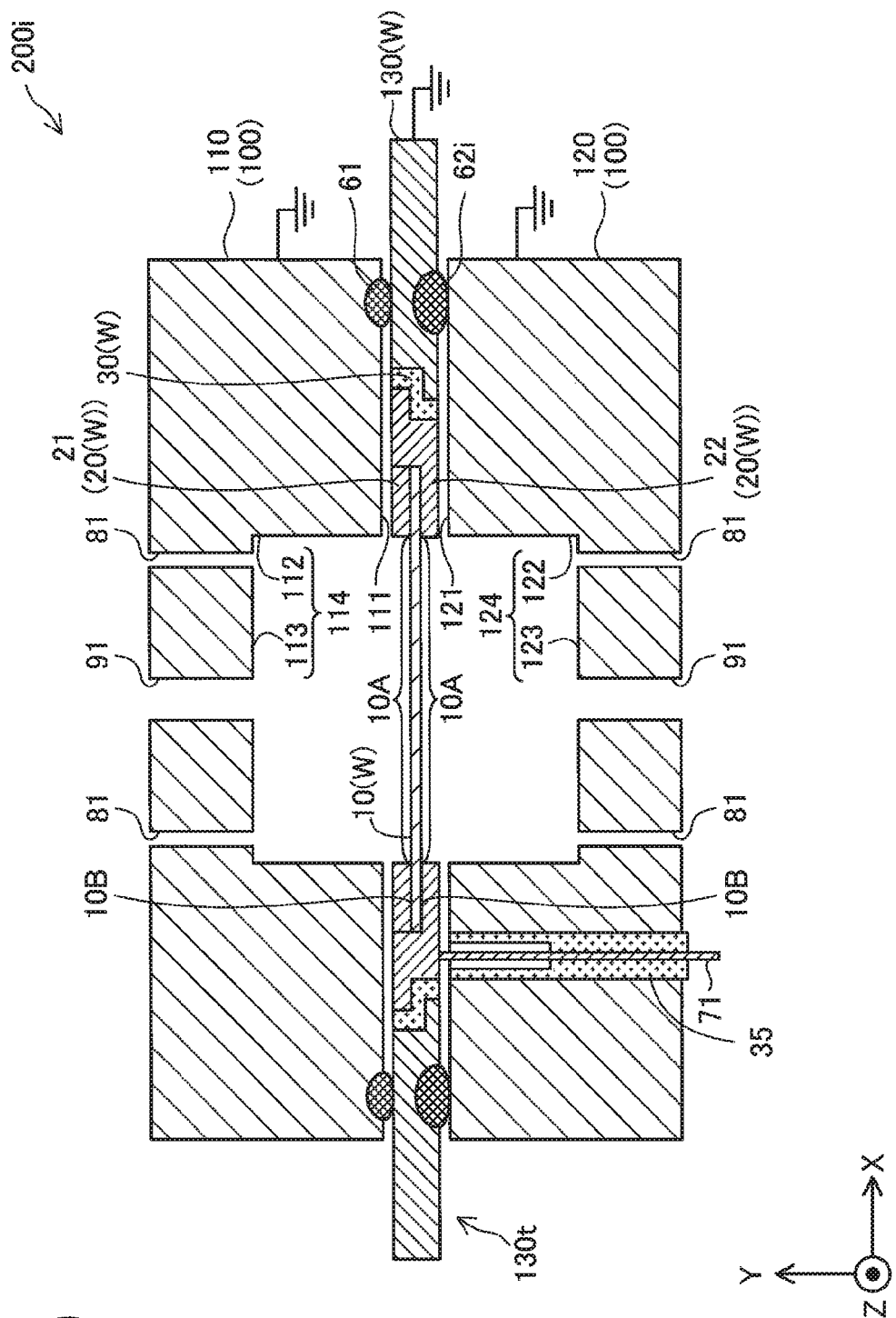
FIG. 9 is a schematic sectional view illustrating the configuration of a film forming apparatus according to a second embodiment.

FIG. 9 is a schematic sectional view illustrating the configuration of a film forming apparatus 200i according to a second embodiment. FIG. 9 illustrates the film forming apparatus 200i when the film forming vessel 100 is closed. The film forming apparatus 200i of this embodiment differs from the film forming apparatus 200 of the first embodiment by that a second seal member 62i has a larger diameter than the diameter of the first seal member 61. The diameter of each seal member denotes the thickness of each seal member. Like the first embodiment described above, the second seal member 62i is provided on the lower face of the work W in this embodiment. According to this embodiment, the diameter of the second seal member 62i is larger than the diameter of the first seal member 61. The contact area between the second seal member 62i and the second planar portion 121 is thus larger than the contact area between the first seal member 61 and the first planar portion 111, when the film forming vessel 100 is closed. As shown in FIG. 9, the width of the second seal member 62i in the X direction is accordingly larger than the width of the first seal member 61 in the X direction. In the film forming apparatus 200i shown in FIG. 9, the position of center in the X direction of the second seal member 62i is identical with the position of center in the X direction of the first seal member 61.

According to this embodiment, the diameter of the second seal member 62i is approximately 8 mm, and the diameter of the first seal member 61 is approximately 4 mm. The diameter of the second seal member 62i may be, for example, in a range of not less than 6 mm and not greater than 10 mm, and the diameter of the first seal member 61 may be, for example, in a range of not less than 3 mm and not greater than 5 mm. The other configuration of the film forming apparatus 200i of this embodiment is similar to that of the film forming apparatus 200 of the first embodiment described above, and the description is omitted.

B2. Advantageous Effects

In the film forming apparatus 200i of this embodiment, the diameter of the second seal member 62i is larger than the diameter of the first seal member 61. This configuration causes the contact area between the second seal member 62i and the second planar portion 121 to be larger than the contact area between the first seal member 61 and the first planar portion 111 or the contact area between the first seal member 61 and the work W, when the film forming vessel 100 is closed. Even when an undesired substance falls off on the second mold 120 and adheres to the second seal member 62i, this configuration enables the second planar portion 121 of the second mold 120 to come into contact with the second seal member 62i in a place of the second seal member 62i where no undesired substance adheres to. This configuration accordingly keeps the inside of the film forming vessel 100 airtight when the film forming vessel 100 is closed, and thereby effectively suppresses poor film formation.

The diameter of the second seal member 62i is larger than the diameter of the first seal member 61, and this provides the larger contact area between the second seal member 62i and the second planar portion 121. Even when there is a positional misalignment of the work W in the course of conveyance of the work W into the film forming vessel 100, this configuration makes it likely that at least part of the position in the X direction of the first seal member 61 shown in FIG. 9 overlaps with at least part of the position in the X direction of the second seal member 62i. Accordingly, even when there is a positional misalignment of the work W in the course of conveyance of the work W into the film forming vessel 100, this configuration is likely to keep the inside of the film forming vessel 100 airtight when the film forming vessel 100 is closed, and thereby suppresses poor film formation.

C. Third Embodiment

C1. Film Forming Method

Figure 10:
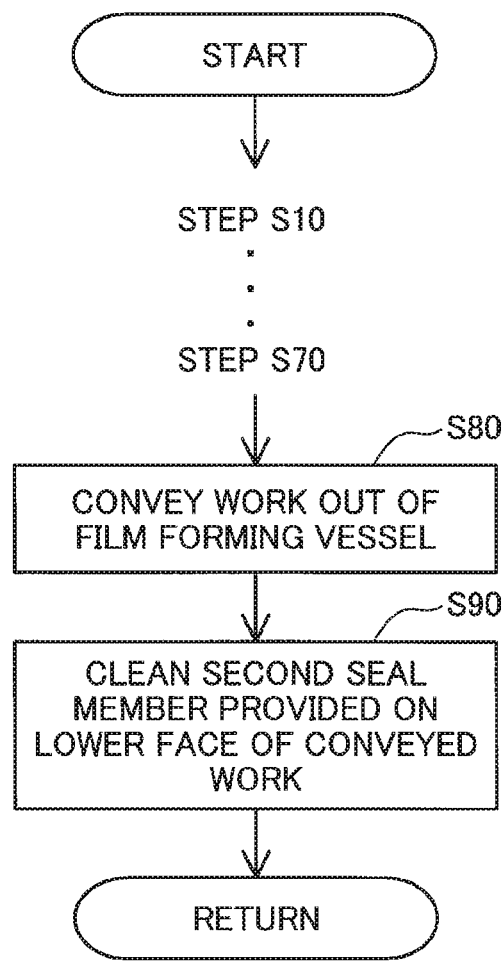
FIG. 10 is a process chart showing a film forming method according to a third embodiment.

FIG. 10 is a process chart showing a film forming method according to a third embodiment. The following describes another film forming method employable for film formation using the film forming apparatus 200 of the first embodiment. As in the first embodiment, the process of step S10 to step S70 shown in FIG. 4 is performed in this embodiment. The work W is subsequently conveyed out of the film forming vessel 100 (step S80 in FIG. 10). According to this embodiment, after the film formation, the controller 95 controls the conveyance device 55 to convey the pallet 130 with the insulating member 30, the masking member 20 and the film formation object 10 placed thereon (i.e., the work W) out of the film forming vessel 100. This process is also called "process (c)".

The second seal member 62 provided on the lower face of the work W conveyed out of the film forming vessel 100 is then cleaned (step S90 in FIG. 10). According to this embodiment, after removal of the film formation object 10 from the pallet 130 with the insulating member 30, the masking member 20 and the film formation object 10 placed thereon (i.e., the work W), the insulating member 30, the masking member 20, the pallet 130 and the second seal member 62 are cleaned. For example, the process of cleaning may spray the air onto the masking member 20, the insulating member 30, the pallet 130 and the second seal member 62 to remove any undesired substance adhering to these components. In another example, the process of cleaning may use a brush to remove any undesired substance adhering to these components. This process is also called "process (d)". Cleaning may be performed only for the second seal member 62.

After cleaning, the work W (insulating member 30, masking member 20 and non-film-formed film formation object 10) provided with the second seal member 62 cleaned at step S90 is conveyed into the film forming vessel 100 by the conveyance device 55 (step S10). According to this embodiment, the second seal member 62 may thus be reused for film formation.

C2. Advantageous Effects

Even when an undesired substance adheres to the second seal member 62 provided on the work W, the film forming method of the third embodiment conveys the work W out of the film forming vessel 100 and cleans the second seal member 62. This enables the undesired substance to be removed from the second seal member 62 outside of the film forming vessel 100. In the case of film formation reusing the second seal member 62, this configuration keeps the inside of the film forming vessel 100 airtight when the film forming vessel 100 is closed, and thereby suppresses poor film formation.

Even when an undesired substance falls on the second planar portion 121 of the second mold 120 after conclusion of step S70 in the first cycle of film formation by the film forming apparatus 200, the undesired substance falling on the second planar portion 121 may be bonded to and collected by the second seal member 62 provided on the lower face of the work W conveyed into the film forming vessel 100 in the second cycle of film formation. The undesired substance collected by the second seal member 62 in the second cycle of film formation is conveyed together with the work W out of the film forming vessel 100 and is removed from the second seal member 62 by cleaning. This configuration suppresses deposition of the undesired substance on the second planar portion 121. This configuration reduces the undesired substance in the film forming vessel 100 and thereby further suppresses poor film formation.

C3. Modification of Third Embodiment

The above third embodiment describes the film forming method employed for film formation using the film forming apparatus 200 of the first embodiment. According to a modification, this film forming method may be employed for film formation using the film forming apparatus 200h according to modification 1 of the first embodiment. More specifically, the film forming method may be performed using the film forming apparatus 200h configured such that the first seal member 61h is provided on the upper face of the work W (pallet 130h) and that the second seal member 62 is provided on the lower face of the work W. According to this modification, the first seal member 61h, in addition to the second seal member 62, may be cleaned in the above process of cleaning the second seal member 62 (step S90 in FIG. 10).

According to this modification, the first seal member 61h is provided on the upper face of the work W. Even when an undesired substance adheres to the first seal member 61h provided on the work W this modification conveys the work W out of the film forming vessel 100 and cleans the work W to remove the undesired substance from the first seal member 61h outside of the film forming vessel 100. In the case of film formation reusing the first seal member 61h, this configuration keeps the inside of the film forming vessel 100 airtight when the film forming vessel 100 is closed, and thereby suppresses poor film formation.

Like the third embodiment described above, since the second seal member 52h is provided on the lower face of the work W, the film forming method using the film forming apparatus 200h according to this modification keeps the inside of the film forming vessel 100 airtight when the film forming vessel 100 is closed, and thereby suppresses poor film formation.

D. Fourth Embodiment

D1. Configuration of Film Forming Apparatus

Figure 11:
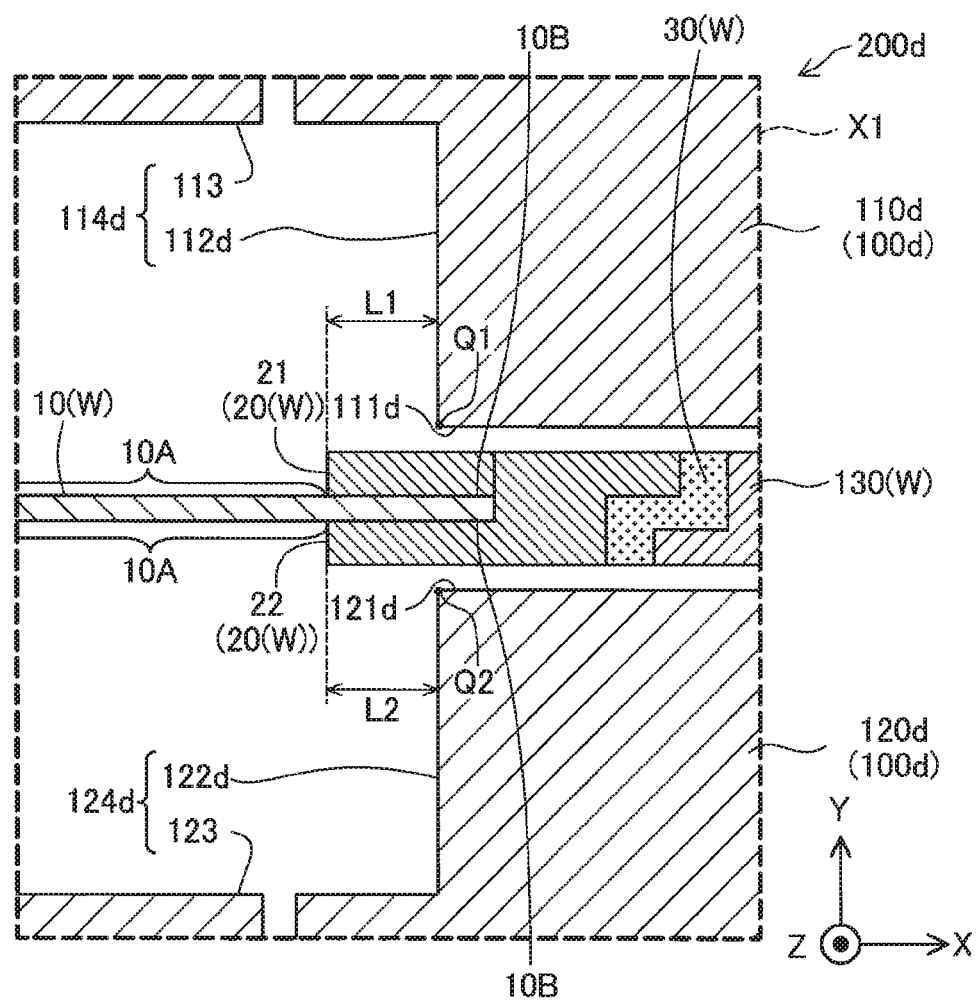
FIG. 11 is a partial schematic sectional view illustrating part of the configuration of a film forming apparatus according to a fourth embodiment.

FIG. 11 is a partial schematic sectional view illustrating part of the configuration of a film forming apparatus 200d according to a fourth embodiment. FIG. 11 illustrates an area X1 corresponding to the area X of FIG. 1. In the film forming apparatus 200d of this embodiment, a connecting position Q1 of a first recessed portion 114d (more specifically, its lateral portion 112d) with a first planar portion 111d of a first mold 110d is located away from an end of the film formation target part 10A toward the insulating member 30. Similarly a connecting position Q2 of a second recessed portion 124d (more specifically, its lateral portion 122d) with a second planar portion 121d of a second mold 120d is located away from the end of the film formation target part 10A toward the insulating member 30.

FIG. 11 shows a distance L1 along the X axis between the connecting position Q1 of the first recessed portion 114d with the first planar portion 111d and the end of the film formation target part 10A. FIG. 11 also shows a distance L2 along the X axis between the connecting position Q2 of the second recessed portion 124d with the second planar portion 121d and the end of the film formation target part 10A. According to this embodiment, the distance L1 is equal to the distance L2. For example, when an electric power of −1000 V is applied to the negative pole of the work W by the power application unit 70 and a film forming vessel 100d has an internal pressure of 10 Pa, the distances L1 and L2 are preferably equal to or greater than approximately 3 mm. In another example, when an electric power of −3000 V is applied to the negative pole of the work W by the power application unit 70 and a film forming vessel 100d has an internal pressure of 10 Pa, the distances L1 and L2 are preferably equal to or greater than approximately 9 mm. The distances L1 and L2 may be changed depending on the electric power applied by the power application unit 70 and the internal pressure (degree of vacuum) of the film forming vessel 100d. The other configuration of the film forming apparatus 200d of this embodiment is similar to that of the film forming apparatus 200 of the first embodiment described above, and the description is omitted.

D2. Advantageous Effects

The film is formed on the film formation target part by producing plasma between the negative pole of the work, to which an electric power is applied, and the film forming vessel. It is accordingly preferable that the distance between the film formation target part and the film forming vessel is larger than the distance of the sheath. Plasma may not be produced in a place where the film formation target part is near to the film forming vessel. This may cause poor film formation at an end of the film formation target part. In the film forming apparatus 200d of this embodiment, however, the connecting position Q1 of the first recessed portion 114d with the first planar portion 111d in the film forming vessel 100d is located away from the end of the film formation target part 10A of the upper face of the work W toward the insulating member 30. This configuration ensures the distance between the film formation target part 100 of the upper face of the work W and the film forming vessel 100d. This configuration accordingly suppresses poor film formation at the end of the film formation target part 10A of the upper face of the work W.

The connecting position Q2 of the second recessed portion 124d with the second planar portion 121d in the film forming vessel 100d is located away from the end of the film formation target part 10A of the lower face of the work W toward the insulating member 30. This configuration ensures the distance between the film formation target part 10A of the lower face of the work W and the film forming vessel 100d. This configuration accordingly suppresses poor film formation at the end of the film formation target part 10A of the lower face of the work W.

Additionally, the film forming apparatus 200d of this embodiment has the advantageous effect similar to the advantageous effect 2 of the first embodiment described above. The film forming apparatus 200d accordingly reduces the possibility of abnormal electrical discharge.

D3. Modification of Fourth Embodiment

According to the fourth embodiment described above, the distance L1 between the connecting position Q1 of the first recessed portion 114d with the first planar portion 111d and the end of the film formation target part 10A is equal to the distance L2 between the connecting position Q2 of the second recessed portion 124d with the second planar portion 121d and the end of the film formation target part 10A. According to a modification, the distance L1 may be different from the distance L2. For example, only the connecting position Q1 of the first recessed portion 114d with the first planar portion 111d may be located away from the end of the film formation target part 10A of the upper face of the work W toward the insulating member 30, or only the connecting position Q2 of the second recessed portion 124d with the second planar portion 121d may be located away from the end of the film formation target part 10A of the lower face of the work W toward the insulating member 30.

E. Other Modifications

In the embodiments described above, the film formation object 10 is a separator. The film formation object 10 may, however, be any member having electrical conductivity. In the above embodiments, each of the film forming apparatuses 200 to 200m is configured to form a carbon-based thin film. The film forming apparatus may, however, be configured to form a thin film of another conductive element such as gold (Au), platinum (Pt), tantalum (Ta) or silicon (Si).

In the above embodiments, the first seal member 61 or 61h and the second seal member 62 or 62i are rubber annular members. According to a modification, the first seal member 61 or 61h may be any member that is provided on the upper face of the first planar portion 111, 111d or 111m or the upper face of the work W and is configured to keep the inside of the film forming vessel 100, 100*d* or 100*m* airtight when the film forming vessel 100, 100*d* or 100*m* is closed. The second seal member 62 or 62*i* may be any member that is provided on the lower face of the work W and is configured to keep the inside of the film forming vessel 100, 100*d* or 100*m* airtight when the film forming vessel 100, 100*d* or 100*m* is closed. Each seal member may be integrated with the upper face of the first planar portion 111, 111*d* or film or the upper face of the work W or may be integrated with the lower face of the work W by attachment or injection molding. For example, when the first seal member 61 is integrated with the first mold 110, the first seal member 61 may be formed in a convex structure or an angle structure that has a bottom portion on the first mold 110-side and faces the work W (pallet 130).

The disclosure is not limited to any of the embodiments and their modifications described above but may be implemented by a diversity of other configurations without departing from the scope of the disclosure. For example, the technical features of any of the embodiments and their modifications may be replaced or combined appropriately, in order to solve part or all of the problems described above or in order to achieve part or all of the advantageous effects described above. The elements other than those described in independent claims among the elements included in the respective embodiments and their modifications described above are additional elements and may be appropriately omitted. The present disclosure may be implemented by aspects described below.

(1) According to one aspect of the disclosure, there is provided a film forming apparatus configured to form a film on part of a work. This film forming apparatus comprises a film forming vessel comprising a first mold located above the work and a second mold located below the work to be opposed to the first mold. The first mold is configured to include a first recessed portion that is recessed upward viewed from a film formation target part of the work and a first planar portion arranged around the first recessed portion. The second mold is configured to include a second planar portion in a place opposed to the first planar portion. The film forming apparatus also comprises a first seal member located between the first planar portion and the work. The first seal member is configured to come into contact with the first planar portion and the work when the work is away from the first planar portion. The film forming apparatus further comprises a second seal member located between the second planar portion and the work. The second seal member is configured to come into contact with the second planar portion and the work when the work is away from the second planar portion. The second seal member is provided on a lower face of the work. In the film forming apparatus of this aspect, the second seal member is provided on the lower face of the work. Even when an undesired substance falls off, this configuration suppresses the undesired substance from adhering to the second seal member. This configuration accordingly keeps the inside of the film forming vessel airtight when the film forming vessel is closed, and thereby suppresses poor film formation.

(2) In the film forming apparatus of the above aspect, the first seal member may be provided on the first planar portion. In the film forming apparatus of this aspect, the first seal member is provided on the first planar portion of the first mold that is placed above the work. Even when an undesired substance falls off, this configuration suppresses the undesired substance from adhering to the first seal member. This configuration accordingly keeps the inside of the film forming vessel airtight when the film forming vessel is closed, and thereby suppresses poor film formation. The first seal member is provided on the first planar portion. This configuration does not need to provide the first seal members separately for a plurality of works in the case where film formation is performed for the plurality of works by the film forming apparatus. This configuration accordingly reduces the required number of first seal members.

(3) In the film forming apparatus of the above aspect, the second seal member may have a diameter larger than a diameter of the first seal member. In the film forming apparatus of this aspect, the diameter of the second seal member is larger than the diameter of the first seal member. This causes the contact area between the second seal member and the second planar portion to be larger than the contact area between the first seal member and the first planar portion or the contact area between the first seal member and the work, when the film forming vessel is closed. Even when an undesired substance in the film forming vessel falls off on the second mold and adheres to the second seal member, this configuration enables the second planar portion of the second mold to come into contact with the second seal member in a place of the second seal member where no undesired substance adheres to. This configuration accordingly keeps the inside of the film forming vessel airtight when the film forming vessel is closed, and thereby effectively suppresses poor film formation.

(4) According to another aspect of the disclosure, there is provided a film forming method of forming a film on part of a work by a film forming apparatus. The film forming apparatus comprises a film forming vessel comprising a first mold located above the work and a second mold located below the work to be opposed to the first mold. The first mold is configured to include a first recessed portion that is recessed upward viewed from a film formation target part of the work and a first planar portion arranged around the first recessed portion. The second mold is configured to include a second planar portion in a place opposed to the first planar portion. The film forming apparatus also comprises a first seal member located between the first planar portion and the work. The first seal member is configured to come into contact with the work when the work is away from the first planar portion. The film forming apparatus further comprises a second seal member located between the second planar portion and the work. The second seal member is configured to come into contact with the work when the work is away from the second planar portion. The second seal member is provided on a lower face of the work. This film forming method comprises (a) moving the first mold upward relative to the work under condition that the first mold and the work are in contact with the first seal member and that the second mold and the work are in contact with the second seal member; and (b) moving the work upward relative to the second mold after starting the (a). The film forming method of this aspect moves the work upward relative to the second mold after moving the first mold upward relative to the work. This configuration suppresses an undesired substance out of a space formed by the second mold and the work from invading between the second mold and the work before the second seal member provided on the lower face of the work is separated from the second planar portion. This configuration accordingly keeps the inside of the film forming vessel airtight when the film forming vessel is closed, and thereby suppresses poor film formation. Additionally, the second seal member is provided on the lower face of the work. Even when an undesired substance falls off, the configuration of moving the work upward relative to the second mold suppresses the undesired substance from adhering to the second seal member and thereby suppresses poor film formation.

(5) The film forming method of the above aspect may perform the (b) after stopping the moving the first mold in the (a). Even when an undesired substance falls off by the vibration during the upward move of the first mold relative to the work, the film forming method of this configuration suppresses the undesired substance from invading between the second mold and the work before the second seal member provided on the lower face of the work is separated from the second planar portion. This accordingly further suppresses the undesired substance from adhering to the second seal member. This configuration further keeps the inside of the film forming vessel airtight when the film forming vessel is closed, and thereby further suppresses poor film formation.

(6) The film forming method of the above aspect may further comprise (c) conveying the work out of the film forming vessel, after the (b); and (d) cleaning the second seal member provided on the lower face of the work conveyed out of the film forming vessel, after the (c). Even when an undesired substance adheres to the second seal member provided on the work, the film forming method of this aspect conveys the work out of the film forming vessel and cleans the second seal member. This enables the undesired substance to be removed from the second seal member outside of the film forming vessel. In the case of film formation reusing the second seal member, this configuration keeps the inside of the film forming vessel airtight when the film forming vessel is closed, and thereby suppresses poor film formation.

The disclosure may be implemented by any of various aspects other than the film forming apparatus and the film forming method described above, for example, a control method and a control apparatus of the film forming apparatus, a method of conveying a work in the film forming apparatus, a computer program configured to implement any of these apparatuses and methods, and a non-transitory recording medium in which such a computer program is recorded.

What is claimed is:

1. A film forming method of forming a film on part of a work by a film forming apparatus, the film forming apparatus comprising:
   a film forming vessel comprising a first mold located above the work and a second mold located below the work to be opposed to the first mold, the first mold being configured to include a first recessed portion that is recessed upward viewed from a film formation target part of the work and a first planar portion arranged around the first recessed portion, the second mold being configured to include a second planar portion in a place opposed to the first planar portion, wherein the film forming vessel is configured to sandwich the work with the first and second molds;
   a first seal member located between the first planar portion and the work, the first seal member being configured to come into contact with the first planar portion and the work with the work separated from the first planar portion; and
   a second seal member located between the second planar portion and the work, the second seal member being configured to come into contact with the second planar portion and the work with the work separated from the second planar portion, wherein the second seal member is provided on a lower face of the work,
   the film forming method comprising:
   (a) moving the first mold upward relative to the work under condition that the first mold and the work are in contact with the first seal member and that the second mold and the work are in contact with the second seal member; and
   (b) moving the work upward relative to the second mold after starting the (a).

2. The film forming method according to claim 1, the film forming method performing the (b) after stopping the moving the first mold in the (a).

3. The film forming method according to claim 1, further comprising:
   (c) conveying the work out of the film forming vessel, after the (b); and
   (d) cleaning the second seal member provided on the lower face of the work conveyed out of the film forming vessel, after the (c).

4. The film forming method according to claim 1,
   wherein the film formation target part of the work is provided on an upper face side of the work; and
   wherein the second mold includes a second recessed portion that is recessed downward viewed from the film formation target part of the work, the second planar portion being arranged in a place opposed to the first planar portion around the second recessed portion.

\* \* \* \* \*